US012671432B2

(12) United States Patent
Kee

(10) Patent No.: US 12,671,432 B2
(45) Date of Patent: Jun. 30, 2026

(54) SIGNAL-ADAPTIVE AND TIME-DEPENDENT ANALOG-TO-DIGITAL CONVERSION RATE IN A RANGING RECEIVER

(71) Applicant: AyDeeKay LLC, Aliso Viejo, CA (US)

(72) Inventor: Scott David Kee, Aliso Viejo, CA (US)

(73) Assignee: AyDee Kay LLC, Aliso Viejo, CA (US)

( * ) Notice: Subject to any disclaimer, the term of this patent is extended or adjusted under 35 U.S.C. 154(b) by 436 days.

(21) Appl. No.: 17/964,027

(22) Filed: Oct. 11, 2022

(65) Prior Publication Data

US 2023/0124956 A1     Apr. 20, 2023

Related U.S. Application Data

(60) Provisional application No. 63/270,010, filed on Oct. 20, 2021.

(51) Int. Cl.
*H03M 1/12*          (2006.01)
*G01S 7/285*          (2006.01)
(Continued)

(52) U.S. Cl.
CPC ............. *H03M 1/126* (2013.01); *H03M 1/34* (2013.01); *G01S 7/285* (2013.01); *G01S 7/4861* (2013.01); *G01S 7/526* (2013.01)

(58) Field of Classification Search
CPC ...... H03M 1/126; H03M 1/34; H03M 1/1255; G01S 7/285; G01S 7/4861; G01S 7/526; G01S 17/02
(Continued)

(56) References Cited

U.S. PATENT DOCUMENTS 6,115,113 A * 9/2000 Flockencier .......... G01S 7/4812
356/5.01
6,965,616 B1 * 11/2005 Quigley ............ H04L 25/03343
370/480
(Continued)

FOREIGN PATENT DOCUMENTS

CN          104316909 A      1/2015
CN          104931973 A      9/2015
(Continued)

OTHER PUBLICATIONS

PCT Patent Appl. Serial No. PCT/US22/46493, International Search Report and Written Opinion, Jan. 27, 2023.

*Primary Examiner* — Nuzhat Pervin
(74) *Attorney, Agent, or Firm* — Steven Stupp

(57) ABSTRACT

An integrated circuit may include a ranging receiver that includes an analog-to-digital converter (ADC) having a time-variant sampling or data rate. Notably, the sampling rate may be increased when a return signal is detected by the ranging receiver. For example, the return signal may be detected using a matched filter (such as a correlation of the return signal and a target signal) and a comparator having a time-variant threshold. The time-variant threshold may be decreased as a function of time after a transmit signal is output in order to track the channel response, such as a decrease in the return signal amplitude for objects at larger ranges. Alternatively or additionally, the sampling rate may be increased based at least in part on a predefined function (such as a closed-form expression or a stepwise function, e.g., a stairstep function) after the transmit signal is output.

21 Claims, 10 Drawing Sheets

(51) Int. Cl.
G01S 7/4861 (2020.01)
G01S 7/526 (2006.01)
H03M 1/34 (2006.01)

(58) Field of Classification Search
USPC ........................................................ 342/132
See application file for complete search history.

(56) References Cited

U.S. PATENT DOCUMENTS

| | | | | |
|---|---|---|---|---|
| 7,184,130 B1 * | 2/2007 | Barr | ...................... | G01S 7/4861 356/4.02 |
| 7,242,638 B2 * | 7/2007 | Kerfoot | .............. | G01S 15/8904 367/12 |
| 7,539,126 B2 * | 5/2009 | Geile | ...................... | H04L 27/34 370/335 |
| 7,639,347 B2 * | 12/2009 | Eaton | .................... | G01S 7/4818 356/5.1 |
| 7,656,341 B2 * | 2/2010 | Reeves | ................... | G01S 13/32 342/195 |
| 7,656,932 B2 * | 2/2010 | Durand | ............... | H04B 1/7093 375/144 |
| 7,660,342 B2 * | 2/2010 | Durand | ............... | H04B 1/7093 375/147 |
| 7,872,583 B1 * | 1/2011 | Yushkov | .............. | G01S 13/767 702/158 |
| 8,204,707 B2 * | 6/2012 | Dimsdale | ............... | G04F 10/00 702/79 |
| 8,698,670 B2 * | 4/2014 | Matsuo | ................ | G01S 13/284 342/131 |
| 8,764,651 B2 * | 7/2014 | Tran | .................... | A61B 5/7203 600/300 |
| 8,781,790 B2 * | 7/2014 | Zhu | ......................... | G01S 17/48 356/3.01 |
| 9,335,403 B2 * | 5/2016 | Lewis | .................. | G01S 7/4915 |
| 9,444,503 B2 * | 9/2016 | Arne | ................... | H04B 13/005 |
| 9,660,840 B1 * | 5/2017 | Zerbe | ............... | H04L 25/03019 |
| 9,684,066 B2 * | 6/2017 | Bartolome | ........... | G01S 7/4861 |
| 10,101,438 B2 * | 10/2018 | Subburaj | ................ | G01S 7/354 |
| 10,206,610 B2 * | 2/2019 | Al-Alusi | ............. | A61B 5/7278 |
| 10,305,611 B1 * | 5/2019 | Rimini | ................... | G01S 13/86 |
| 10,517,479 B2 * | 12/2019 | Tran | .................... | A61B 5/0022 |
| 10,627,485 B2 * | 4/2020 | Swanson | .............. | G01S 7/4817 |
| 10,637,490 B2 * | 4/2020 | Nikitin | ................. | H03M 3/456 |
| 10,757,000 B2 * | 8/2020 | Gelvin | ................ | H01Q 9/0464 |
| 10,955,547 B2 * | 3/2021 | Ray | ......................... | G01S 7/003 |
| 11,050,591 B2 * | 6/2021 | Nikitin | ................. | H03M 3/344 |
| 11,448,738 B2 * | 9/2022 | Zhu | ....................... | G01S 7/4863 |
| 11,486,980 B2 * | 11/2022 | Ramakrishnan | ...... | H03M 1/126 |
| 2004/0041728 A1 * | 3/2004 | Bromley | ................ | G01S 19/29 342/357.64 |
| 2004/0135992 A1 * | 7/2004 | Munro | ................... | G01S 7/483 356/4.01 |

| | | | | |
|---|---|---|---|---|
| 2004/0249257 A1 * | 12/2004 | Tupin, Jr. | ................. | A61B 5/05 600/407 |
| 2004/0249258 A1 * | 12/2004 | Tupin, Jr. | ................. | A61B 5/05 600/407 |
| 2006/0262833 A1 * | 11/2006 | Durand | ................ | H04B 1/7093 375/E1.018 |
| 2007/0098056 A1 * | 5/2007 | Durand | ................... | H04B 1/30 375/E1.018 |
| 2007/0239001 A1 * | 10/2007 | Mehi | .................... | G10K 11/346 600/437 |
| 2008/0091901 A1 * | 4/2008 | Bennett | .............. | G06F 12/0246 711/E12.008 |
| 2008/0144758 A1 * | 6/2008 | Hunter | .................. | G01S 13/788 375/362 |
| 2008/0170638 A1 * | 7/2008 | Schmidl | .............. | H04B 7/2656 375/295 |
| 2008/0204309 A1 * | 8/2008 | Reeves | ................... | G01S 13/32 342/195 |
| 2010/0090885 A1 * | 4/2010 | Mallik | ................... | G01S 7/003 342/195 |
| 2010/0234720 A1 * | 9/2010 | Tupin, Jr. | ............... | A61B 5/725 600/407 |
| 2012/0257187 A1 * | 10/2012 | Stutz | ....................... | G01S 17/10 356/5.01 |
| 2016/0349368 A1 * | 12/2016 | Stutz | ..................... | G01S 7/4866 |
| 2017/0139036 A1 * | 5/2017 | Nayyar | ................. | G01S 13/343 |
| 2018/0172815 A1 * | 6/2018 | Mckitterick | .......... | G01S 13/343 |
| 2018/0267144 A1 * | 9/2018 | Lin | ....................... | G01S 7/4021 |
| 2018/0321360 A1 * | 11/2018 | Hall | .................... | G01S 7/4865 |
| 2019/0178992 A1 * | 6/2019 | Hall | ...................... | G01S 17/08 |
| 2019/0215005 A1 * | 7/2019 | Nikitin | .................. | H03M 3/422 |
| 2019/0245549 A1 * | 8/2019 | Nikitin | .............. | H03H 17/0219 |
| 2019/0293768 A1 * | 9/2019 | Subasingha | .......... | G01S 7/4873 |
| 2019/0293769 A1 * | 9/2019 | Subasingha | ............ | G01S 17/10 |
| 2019/0293770 A1 * | 9/2019 | Subasingha | .......... | G01S 7/4865 |
| 2020/0083896 A1 * | 3/2020 | Mostafanezhad | ..... | G01S 7/4861 |
| 2020/0209356 A1 * | 7/2020 | Lu | ......................... | G01S 7/4861 |
| 2020/0225345 A1 * | 7/2020 | Ding | ................... | G01S 15/102 |
| 2020/0321928 A1 * | 10/2020 | Rao | ..................... | G01S 13/931 |
| 2020/0328916 A1 * | 10/2020 | Nikitin | ................ | H04B 1/1027 |
| 2021/0063550 A1 * | 3/2021 | Ramakrishnan | ...... | H03M 1/126 |
| 2021/0314201 A1 * | 10/2021 | Nikitin | .................... | H04L 25/08 |
| 2021/0341604 A1 * | 11/2021 | Greenberg | ........... | G01S 7/4818 |
| 2022/0075038 A1 * | 3/2022 | Hall | .................... | G01S 7/4865 |
| 2022/0334244 A1 * | 10/2022 | Li | ......................... | G01S 7/292 |
| 2023/0003579 A1 * | 1/2023 | Gunnam | .............. | G01J 3/2803 |
| 2023/0113535 A1 * | 4/2023 | Zhou | ..................... | G01S 7/4808 356/4.01 |

FOREIGN PATENT DOCUMENTS

| | | | | |
|---|---|---|---|---|
| CN | 106546993 A | 3/2017 | | |
| EP | 1195888 A2 * | 4/2002 | ............. | H03B 23/00 |
| WO | 2014184760 A1 | 11/2014 | | |

* cited by examiner

1000

RECEIVE A RETURN SIGNAL
1010

CONVERT THE RETURN SIGNAL FROM AN
ANALOG DOMAIN TO A DIGITAL DOMAIN
1012

SIGNAL-ADAPTIVE AND TIME-DEPENDENT ANALOG-TO-DIGITAL CONVERSION RATE IN A RANGING RECEIVER

CROSS REFERENCE TO RELATED APPLICATIONS

This application claims priority under 35 U.S.C. 119(e) to U.S. Provisional Application Ser. No. 63/270,010, entitled "Signal-Adaptive and Time-Dependent Analog-to-Digital Conversion Rate in a Ranging Receiver," by Scott David Kee, filed on Oct. 20, 2021, the contents of both of which are herein incorporated by reference.

FIELD

The present disclosure relates to circuit techniques for use in a ranging receiver with broadband signals. Notably, in these circuit techniques, an analog-to-digital converter (ADC) in a ranging receiver has a time-variant sampling rate.

BACKGROUND

Active ranging systems transmit a modulated-carrier signal (in an ultrasound, sonar, radio or optical band of frequencies) towards an object, and then wait for a reflected return wave from the object in the field of view to arrive at a receiver. The difference in time between the received and transmitted signal can be used to determine the range to the object based at least in part on the speed of the carrier wave in the medium.

In existing active ranging systems, amplitude modulated signals, such as variable-position pulse trains, are often used as the waveform that is transmitted and received. Moreover, matched filtering the received signal against the transmitted signal with a variable delay (e.g., using a cross-correlator) often provides an optimal signal-to-noise ratio when determining the delay time between the transmit and receive signals and, thus, the range to the object.

ADCs are often used to digitize the received signal, so that a matched filter can be implemented in the digital domain. In order to achieve high range resolution, the sampling rate of the ADC is typically very high to reduce timing uncertainty. However, for long-range active ranging systems, where the signal return time is long compared to the duration of the modulated pulse train (and, more generally, modulated symbols), this implies that the ADC is digitizing noise at a high data rate much of the time, thereby increasing power consumption.

SUMMARY

Embodiments of an integrated circuit are described. This integrated circuit includes a ranging receiver that receives a return signal corresponding to a transmit signal. Moreover, the integrated circuit or the ranging receiver includes an ADC, with a time-variant sampling rate, that converts the return signal from an analog domain to a digital domain.

Note that the ranging receiver may increase the sampling rate when the return signal is detected. For example, the ranging receiver may detect the return signal using multiple symbols or pulses in the return signal.

Alternatively or additionally, the ranging receiver may increase the sampling rate as a function of time after the transmit signal is output. For example, the sampling rate may be increased based at least in part on a predefined function. This predefined function may include: a stepwise function, or a closed-form expression.

Moreover, the ranging receiver may include a comparator having a time-variant threshold. This comparator may selectively change the sampling rate based at least in part on a comparison of a detection signal corresponding to the return signal and the time-variant threshold. Furthermore, the ranging receiver may include a matched filter that performs a correlation of the return signal and a target signal, and to provide the detection signal. Additionally, the ranging receiver may decrease the time-variant threshold as a function of time after the transmit signal is output. Note that the time-variant threshold may be decreased based at least in part on a second predefined function. For example, the second predefined function may include: a stepwise function, or a closed-form expression. In some embodiments, the comparator includes hysteresis and, after the sampling rate is increased to a higher sampling rate, the comparator may maintain the higher sampling rate for a time interval corresponding to the transmit signal.

Note that the ranging receiver may include a time-of-flight ranging receiver.

Moreover, the integrated circuit may include a transmitter that encodes transmit signals using a set of unique codes over a time period. During a given time interval in the time period, a given transmit signal may be encoded using a given unique code that is different from the unique codes used in other time intervals in the time period. Furthermore, the transmitter may select a starting unique code in the set of unique codes for use in a first time interval in the time period based at least in part on a random value or a transmitter-specific value, and the unique codes in the set of unique codes that are used in subsequent time intervals in the time period may be based at least in part on a predefined pattern. Additionally, the given unique code may include a pulse-position modulation code. In some embodiments, the predefined pattern may include a sequential wrap-around order in the set of unique codes.

Another embodiment provides an electronic device that includes a ranging receiver, a ranging receiver or a system that includes the integrated circuit.

Another embodiment provides a method for sampling a return signal using a ranging receiver. This method includes at least some of the operations performed by the integrated circuit.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

Figure 1:
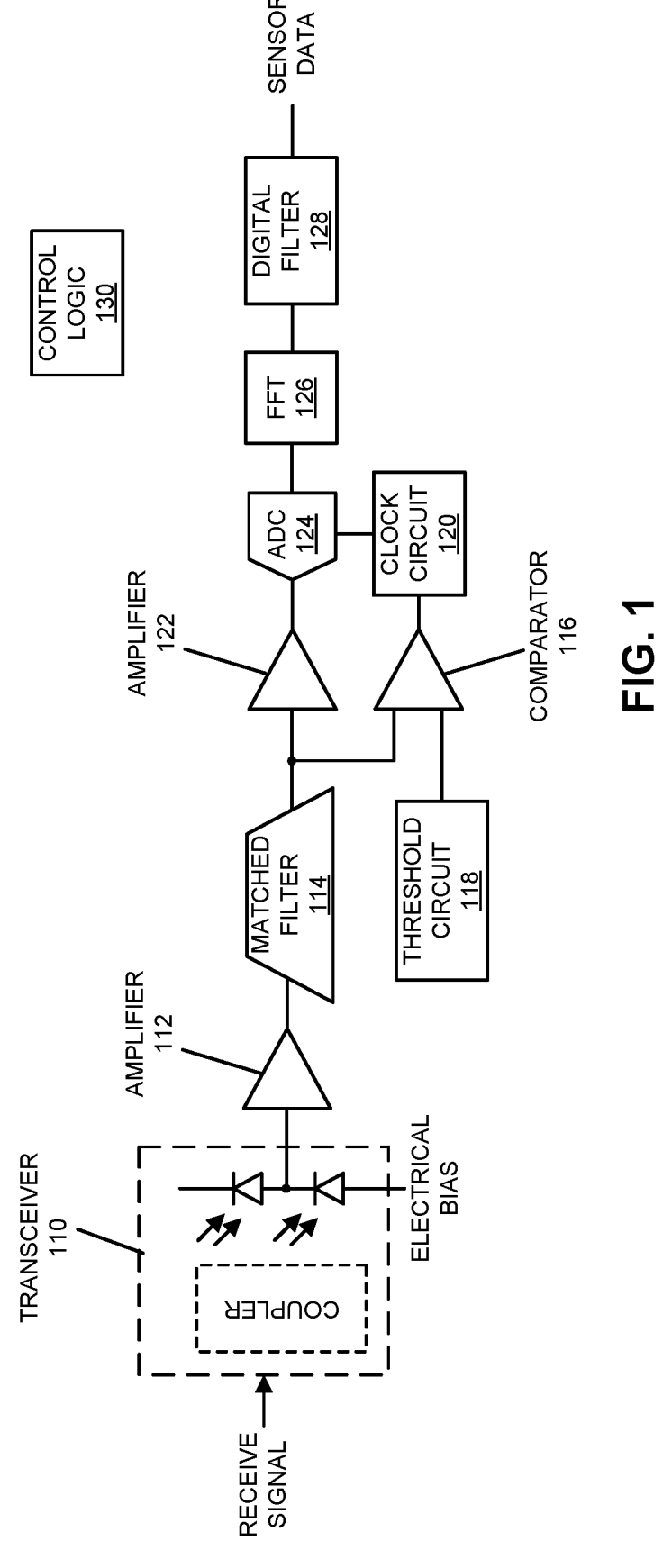
FIG. 1 is a block diagram illustrating an example of a ranging receiver according to some embodiments of the present disclosure.

An integrated circuit is described. This integrated circuit may include a ranging receiver (such as a time-of-flight or an amplitude-sensitive ranging receiver) that includes an ADC having a time-variant sampling rate. Notably, the sampling rate may be increased when a return signal is detected by the ranging receiver. For example, the return signal may be detected using a matched filter (such as a correlation of the return signal and a target signal) and a comparator having a time-variant threshold. The time-variant threshold may be decreased as a function of time after a transmit signal is output in order to track the channel response, such as a decrease in the return signal amplitude for objects at larger ranges. Moreover, in order avoid oscillation in the sampling rate, the integrated circuit may include hysteresis in the sampling-rate adjustment, which may maintain an increased sampling rate for a time interval corresponding to the transmit signal (such as a pulse or symbol width, an inter-symbol waveform or, more generally, a coded waveform). Alternatively or additionally, the sampling rate may be increased based at least in part on a predefined function (such as a closed-form expression or a stepwise function, e.g., a stairstep function) after the transmit signal is output. In some embodiments, the return signal may be detected based at least in part on multiple symbols in the transmit signal. Furthermore, in order to reduce interference, transmit signals in a sequence of time intervals may be encoded using unique codes in a set of unique codes (such as pulse-position modulation codes) with a random or a device-specific starting unique code.

By sampling the return signal using a time-variant sampling rate, these circuit techniques may improve the performance of the ranging receiver. Notably, the time-variant sampling rate may reduce the noise that is sampled by the ranging receiver when the signal return time is long compared to the duration of the transmit signal (such as a long ranges). This may reduce the power consumption of the ranging receiver. Moreover, the sampling rate may be increased when the return signal is detected by the ranging receiver, thereby reducing timing uncertainty. These capabilities may provide improved battery life, thermal management and/or meantime between failure (MTBF) of the overall system components. Consequently, the circuit techniques and/or the ranging receiver may be used in a wide variety of systems, electronic devices and applications, such as LiDAR, sonar, ultrasound and/or radar.

We now describe embodiments of the circuit techniques. These circuit techniques may reduce ADC power consumption in a ranging receiver (such as a time-of-flight or an amplitude-sensitive ranging receiver) without reducing the achievable maximum range and range resolution is described. In the circuit technique, the sampling or data rate of the ADC may be time-variant.

Notably, the sampling rate of the ADC may be a function of the received signal amplitude and/or a time after a transmit signal or waveform (such as a frequency-modulated continuous-wave or FMCW signal) was output. The ADC sampling rate may be reduced when the input signal amplitude or power is very low (e.g., when there is just noise at the input) and may be increased substantially when activity is detected (such as when a return signal is detected by the ranging receiver). Note that return signals from far-away objects buried in the noise may need a longer-length correlation to be detected, so the sampling rate may be higher at larger time offsets from when the transmit signal was output. While the circuit techniques may be used with a wide variety of applications, in the discussion that follows LiDAR is used as an illustrative example.

FIG. 1 presents an example of a ranging receiver 100, a transceiver 110 (such as a photodetector, e.g., coherent detection using balanced diodes) may perform optical-to-electrical conversion. Transceiver 110 may down convert an optical signal having a fundamental frequency in the Tera-Hertz or higher frequencies to baseband (e.g., with a bandwidth of 500 MHz). As described further below with reference to FIGS. 5 and 6, in some embodiments the conversion process may involve mixing with the transmitted (or local oscillator or LO) signal via a buffered optical amplifier (BOA).

Then, ranging receiver 100 may include an optional first amplifier 112 (such as a low-noise amplifier that increases the signal-to-noise ratio of an electrical signal corresponding to a receive signal, such as optical signal). Moreover, the return signal may be detected using an optional matched filter 114 (such as a correlation of the return signal and a target signal) and a comparator 116 having a time-variant threshold provided by threshold circuit 118. Alternatively, instead of using correlation-based detection, comparator 116 in ranging receiver 100 may perform leading-edge detection of, e.g., a Gaussian pulse in the return signal.

Notably, a low-latency threshold comparator 116 may be used to determine whether the input signal amplitude (such as the root-mean-square value) is presently higher than a threshold. When the input signal is higher than the threshold, the sampling clock provided by a clock circuit 120 to an ADC 124 may be commanded or transitioned to a high sampling-rate mode with a latency that is substantially less than the minimum single pulse or symbol width used in a transmit signal (in order to avoid loss of resolution in a potentially useful part of the transmit signal). Because reflected return signals from objects at longer distances or ranges from ranging receiver 100 have reduced amplitudes, the threshold of comparator 116 may be reduced as a function of time after the transmit signal was output in order to track the channel response. In this way, weak return signals from larger ranges may not accidentally be sub-sampled because comparator 116 did not trigger. Moreover, by increasing the sampling rate for weaker (and, thus, lower signal-to-noise-ratio) return signals, ranging receiver 100 may have an improved ability to detect such return signals.

Moreover, ranging receiver 100 may include an optional second amplifier 122 (with baseband gain to match the return signal, or the output signal from matched filter 114 or the first amplifier 112, with the dynamic range of ADC 124, so that utilization of ADC 124 may be increased or optimal); an FFT (or DFT) 126; a digital filter 128 (e.g., digital signal processing or DSP); and an additional processing circuit (not shown), such as range determination, reflectivity determination, etc. Note that the second amplifier 122 may include an anti-aliasing filter (such as a low-pass filter based on the Nyquist frequency). Alternatively, in some embodiments, the anti-aliasing filter may be included between second amplifier 122 and ADC 124. In some embodiments, operation of at least some of the components in ranging receiver 100 may be controlled using control logic 130.

Furthermore, in order to avoid oscillatory behavior in the ADC sampling rate, ranging receiver 100 may include hysteresis in the sampling-rate adjustment, which may maintain an increased sampling rate for a predefined time interval corresponding to the transmit signal (such as a pulse or symbol width, an inter-symbol waveform or, more generally, a coded waveform). In some embodiments, comparator 116 may include a Schmitt trigger. For example, after ADC 124 has been commanded or transitioned to a high sampling-rate mode, it may stay in this mode for a time interval at least equal to the predefined time interval or transmit-signal time before determining whether to switch back to a lower sampling-rate mode. In some embodiments, ADC 124 may remain in a high sampling-rate mode for at least 100 ns.

Figure 2:
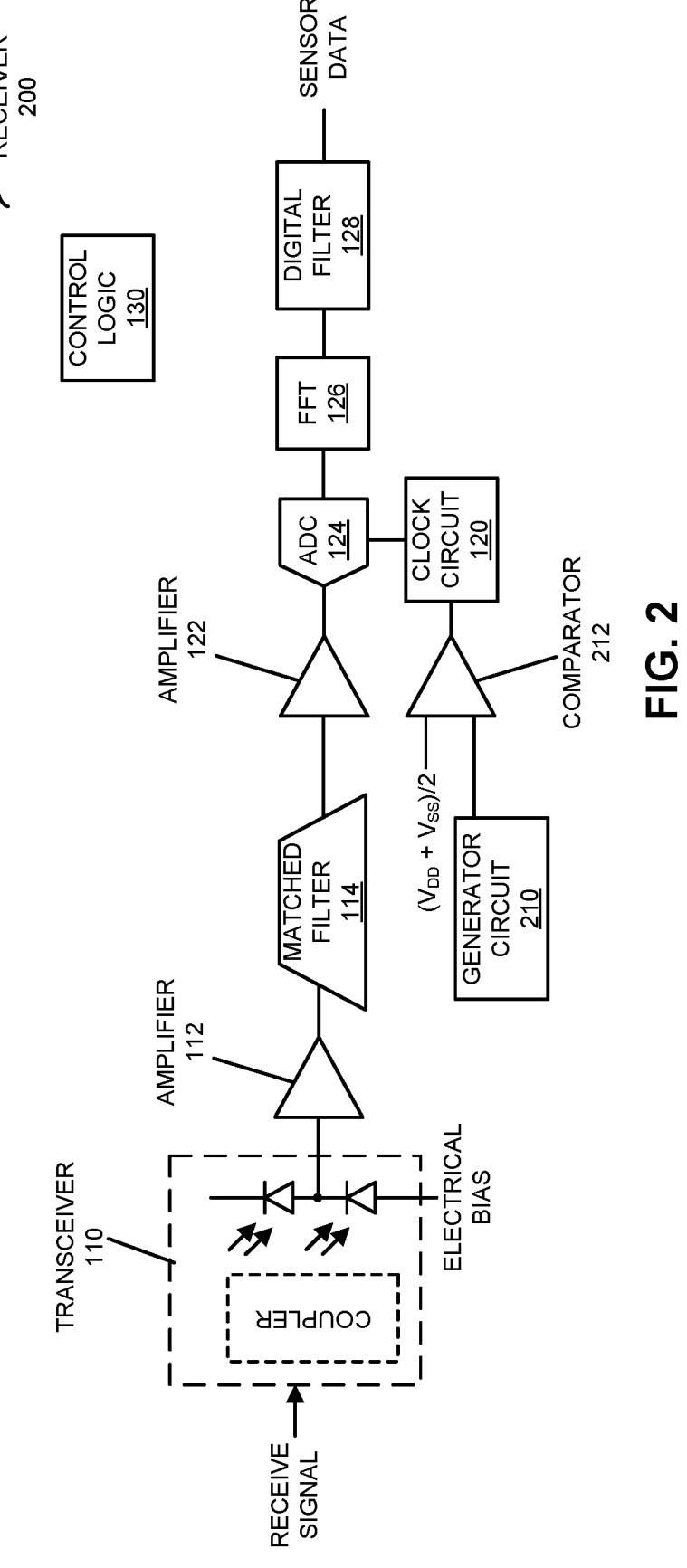
FIG. 2 is a block diagram illustrating an example of a ranging receiver according to some embodiments of the present disclosure.

Alternatively, as shown in FIG. 2, which presents an example of a ranging receiver 200, the sampling rate of ADC 124 may be increased based at least in part on a predefined function (such as a stepwise function, e.g., a stairstep function, a closed-form expression, a non-uniform monotonic function, or a discontinuous monotonic function) after the transmit signal is output. For example, the predefined function may be provided by generator circuit 210 to comparator 212. In these embodiments, the sampling rate may not directly use the properties of the received return signal to adjust the sampling range.

Figure 3:
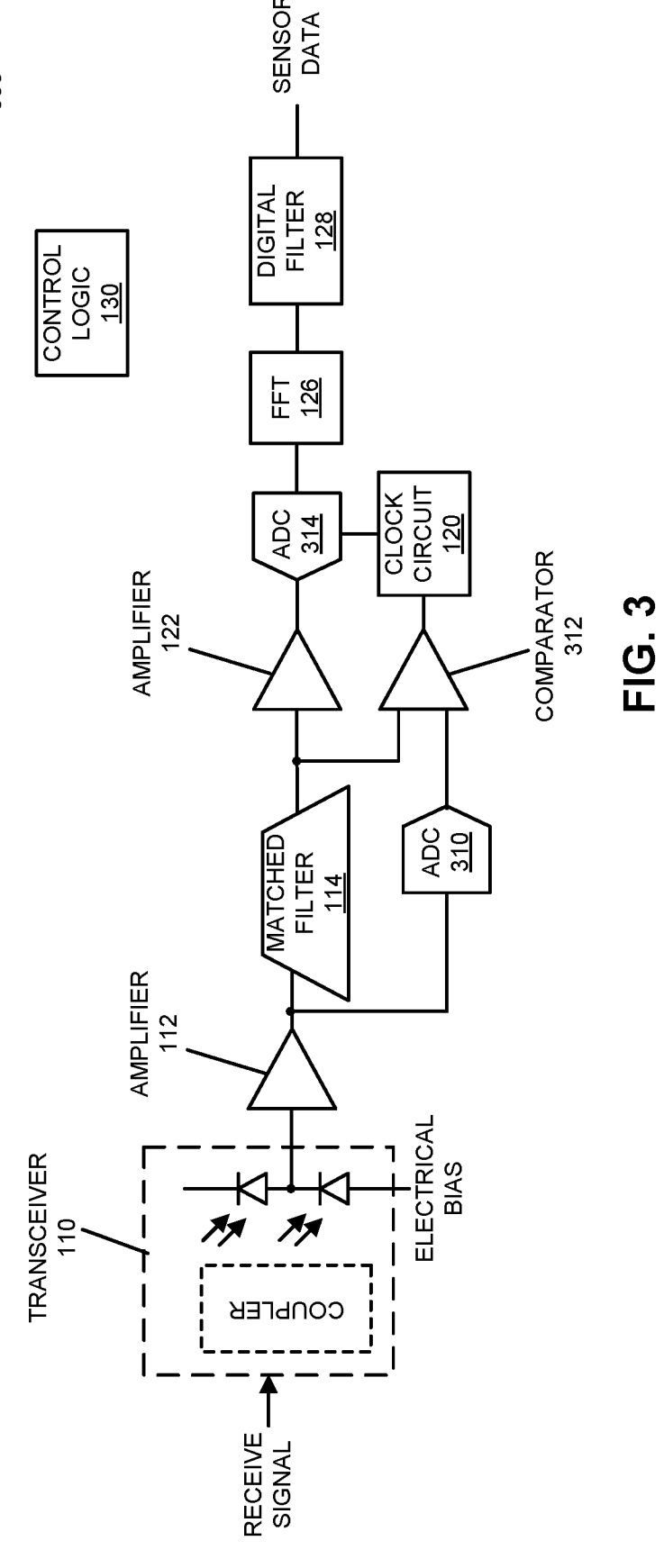
FIG. 3 is a block diagram illustrating an example of a ranging receiver according to some embodiments of the present disclosure.

Furthermore, as shown in FIG. 3, which presents an example of ranging receiver 300, in some embodiments a multi-stage approach is used. Notably, a low-latency low sampling-rate monitoring ADC 310 may provide a digital comparator 312 with a user-defined (and possibly time-dependent) threshold. When this digital comparator 312 indicates a large-enough signal is present at the input (e.g., after transceiver 110 or after the first amplifier 112), a high sampling-rate ADC 314 may be enabled in order to obtain high-resolution data in areas of interest (such as where there is a return signal).

Figure 4:
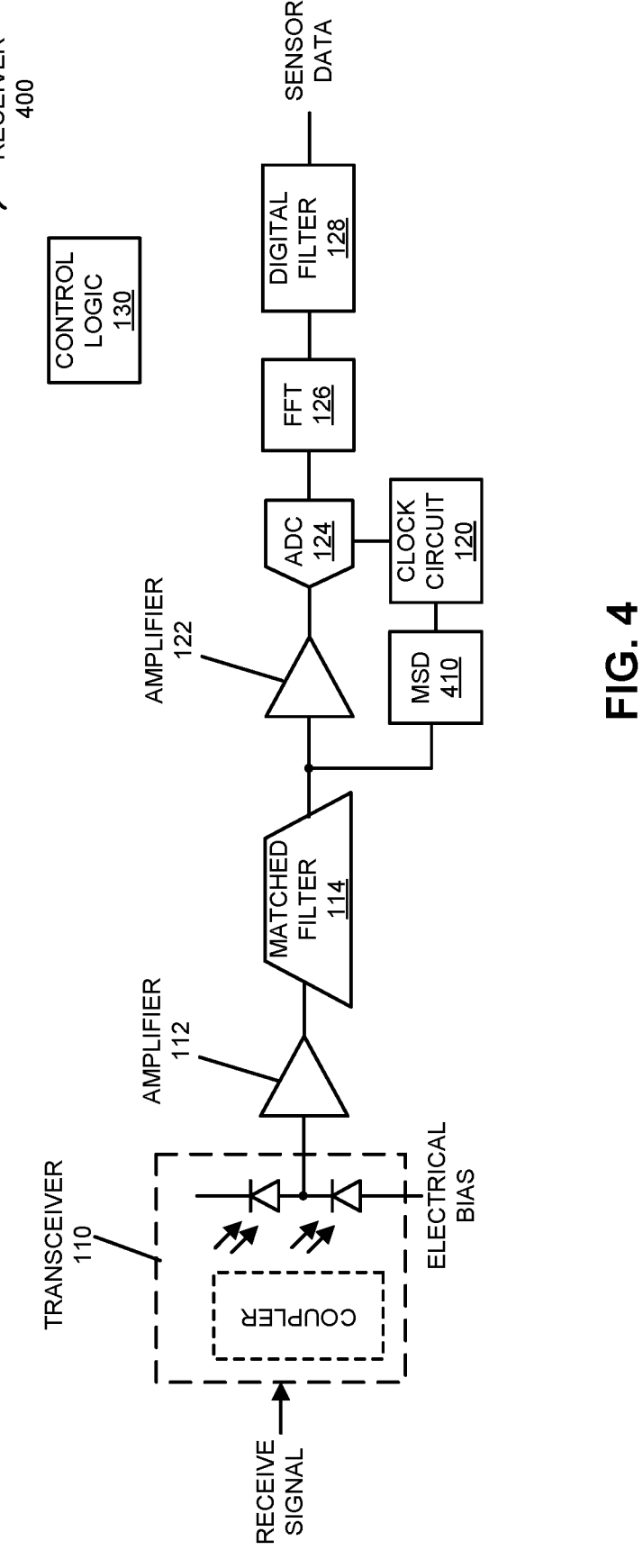
FIG. 4 is a block diagram illustrating an example of a ranging receiver according to some embodiments of the present disclosure.

In some embodiments, as shown in FIG. 4, which presents an example of a ranging receiver 400, a comparator that adjusts ADC 124 sampling rate may be replaced with a coarse partial correlator, such as a correlation circuit that looks for a high correlation or a peak in the received return signal for the first few pulses (or chirps or symbols) of a particular transmit symbol. For example, the correlator may only look at the time crossings of the first two rising edges, and may otherwise ignore amplitude information. This approach may be more robust to noise inadvertently triggering a high sampling-rate conversion. More generally, the adjustment of the sampling rate may be based at least in part on multiple pulses or symbols in the transmit signal that are detected in the received return signal, e.g., by a multi-symbol detector (MSD) 410. In some embodiments, the adjustment of the sampling rate may be based on soft decisions, such as a Viterbi detection technique.

Figure 5:
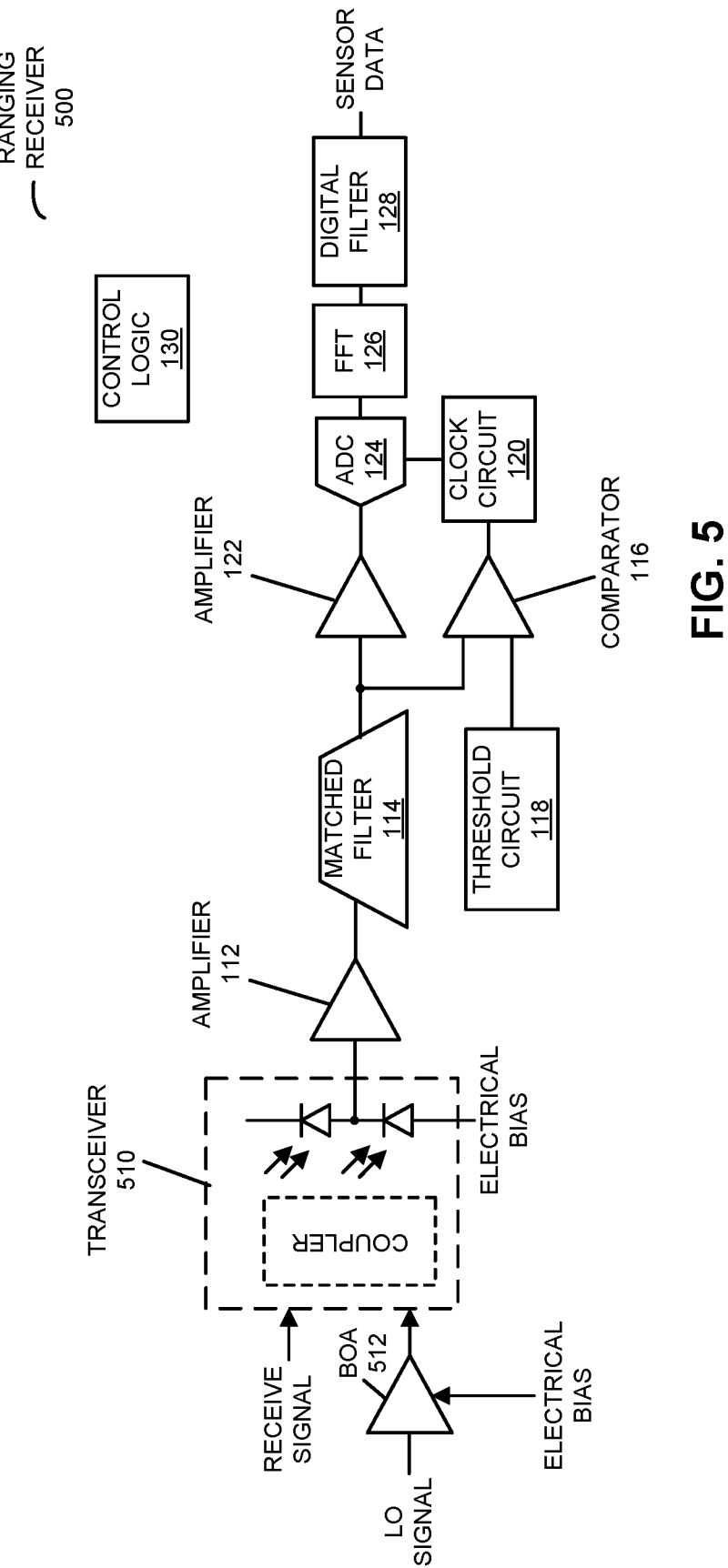
FIG. 5 is a block diagram illustrating an example of a ranging receiver according to some embodiments of the present disclosure.

As shown in FIG. 5, which presents an example of a ranging receiver 500, in some embodiments a transceiver 510 may down convert an optical signal having a fundamental frequency in the TeraHertz or higher frequencies to baseband (such as a bandwidth of 500 MHz). In some embodiments, the conversion process may involve mixing with the transmitted (or local oscillator or LO) signal via a BOA 512.

Figure 6:
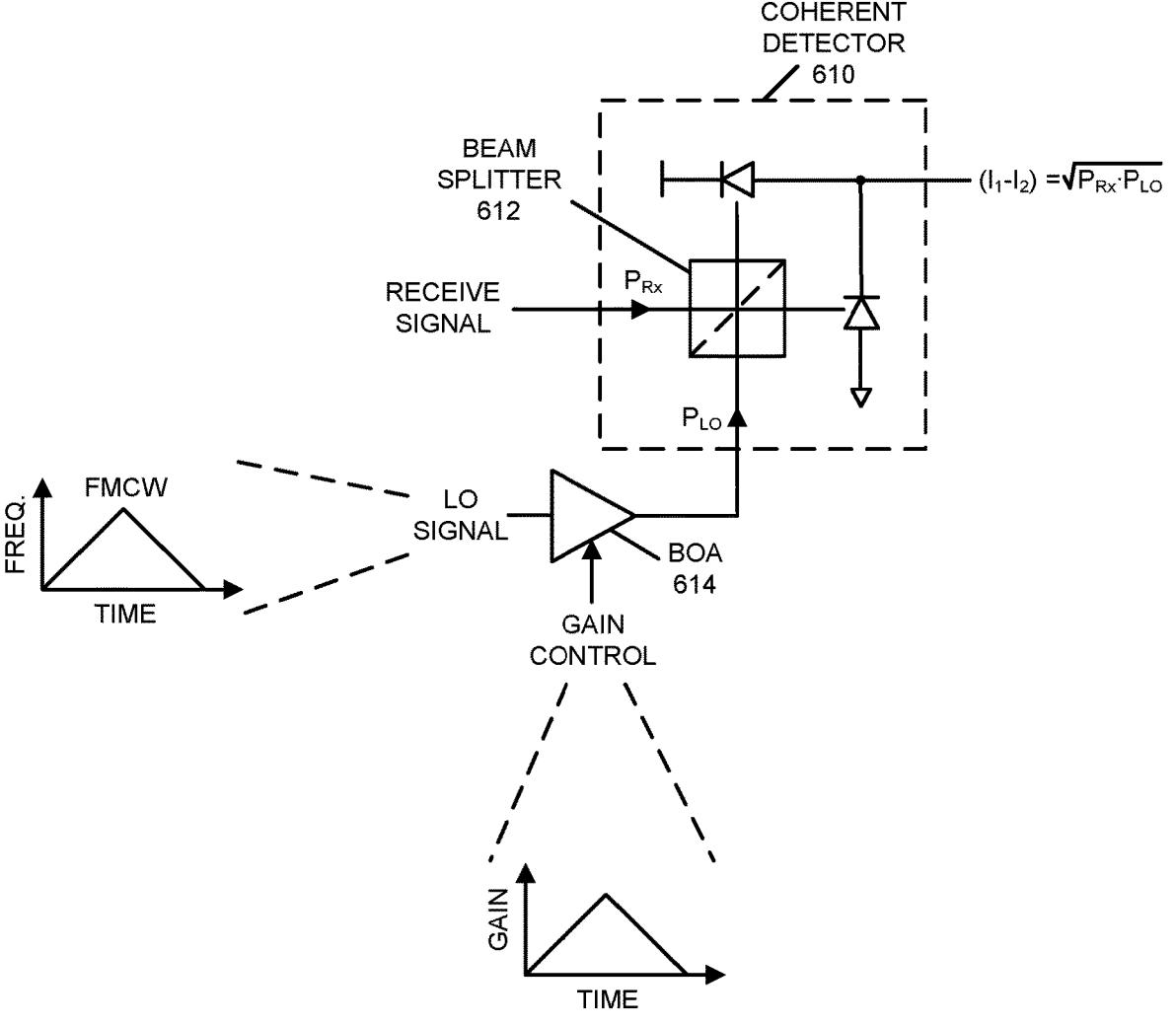
FIG. 6 is a block diagram illustrating an example of a portion of the ranging receiver of FIG. 5 according to some embodiments of the present disclosure.

Moreover, as shown in FIG. 6, which presents an example of a portion of ranging receiver 500 (FIG. 5), in some embodiments the matched filtering (and, more generally, an arbitrary filter characteristic) is provided by varying the optical LO power (or amplitude) as a function of time prior to the optical-to-electrical conversion by a coherent detector 610 (such as a beam splitter 612) in transceiver 510 (FIG. 5). For example, the LO power entering transceiver 510 (FIG. 5) can be ramped analogously to the frequency of the chirp waveform over the coherent processing interval by appropriately adjusting the electrical bias of a BOA 614 in the LO path as a function of time. If the transmit chirp is increasing in frequency, the electrical bias of BOA 614 is adjusted such that the LO power entering transceiver 510 (FIG. 5) also varies from a low to a high value. As the electrical output signal at the output of transceiver 510 (FIG. 5) entering the first amplifier 112 is proportional the square root of the product of the receive signal and LO power, such a time-dependent modulation of the LO power intentionally provides a frequency-dependent gain or frequency-selective gain (such as a high-pass filter characteristic) for the resulting electrical signal. In this example, the high frequencies experience higher gain than lower frequency signals at the electrical output from transceiver 510 (FIG. 5). The use of the frequency-selective gain may allow the ranging receiver to provide high resolution while using an ADC with lower dynamic range. Notably, because reflected chirp signals originating from a more-distant object of a given reflectivity may have a smaller amplitude and a higher generated beat frequency, a frequency-selective gain that emphasizes higher frequencies and attenuates lower-frequency signals may perform frequency-selective equalization of the received signals, which may reduce the dynamic range of the signal referred to the input of ADC 124. This capability may allow the power consumption of the ranging receiver to be reduced, while making it easier to implement a given sampling rate.

Figure 7:
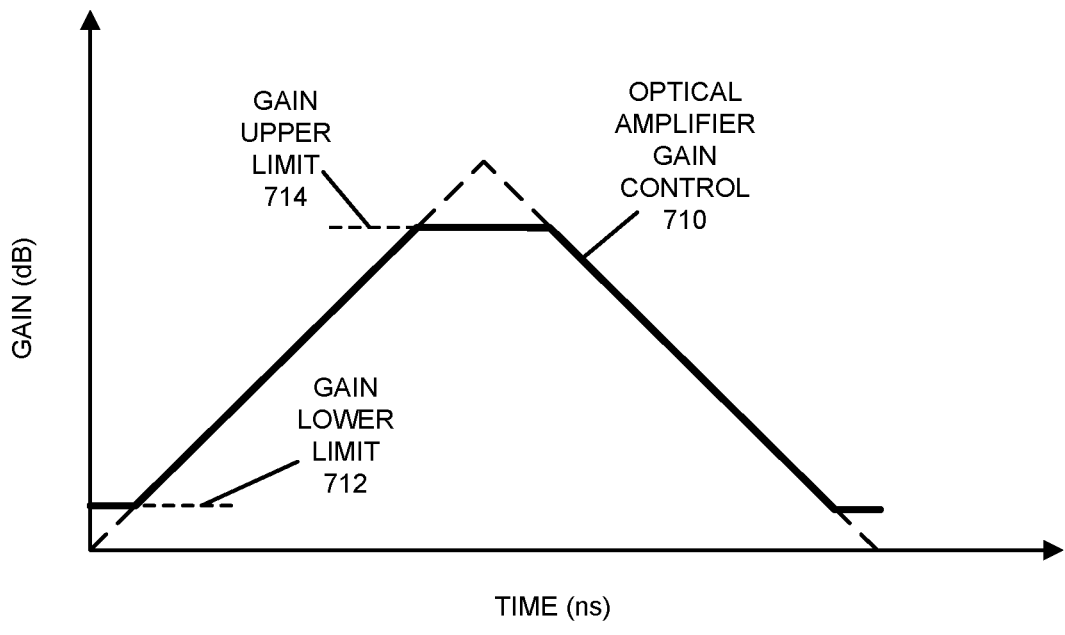
FIG. 7 presents a drawing illustrating an example of optical amplifier gain control of a frequency-selective gain of the ranging receiver of FIG. 6 according to some embodiments of the present disclosure.

In some embodiments, the upper limit of the frequency-selective gain (such as an upper corner frequency), the lower limit of the frequency-selective gain (such as a lower corner frequency), and/or slope of the frequency-selective gain 212 can be programmed to optimize system performance. This is shown in FIG. 7, which presents an example of optical amplifier gain control 710 of a frequency-selective gain of ranging receiver 500 (FIG. 5). Notably, a lower non-zero limit for the gain or gain lower limit 712 of the optical amplifier (such as BOA 614 in FIG. 6) may be used to provide a non-zero LO power for coherent mixing with the received signal to occur successfully. Similarly, an upper limit for the gain or gain upper limit 714 may be used to prevent saturation and/or non-linearity in BOA 614 (FIG. 6) itself. Furthermore, BOA 614 (FIG. 6) and the electrical bias of BOA 614 (FIG. 6) in the receive path may be implemented using substantially the same or matching components as the electrical bias and BOA(s) used in the transmit path in order to improve matching of the coherent mixing process by matching the amplitude and phase characteristics of the resulting optical signals.

While FIG. 6 illustrated implementation of frequency-selective gain using BOA 614 (FIG. 6), in other embodiments the frequency-selective gain may be implemented, at least in part, using an analog pre-filter (e.g., which may be incorporated into matched filter 114 or using a separate analog filter).

Figure 8:
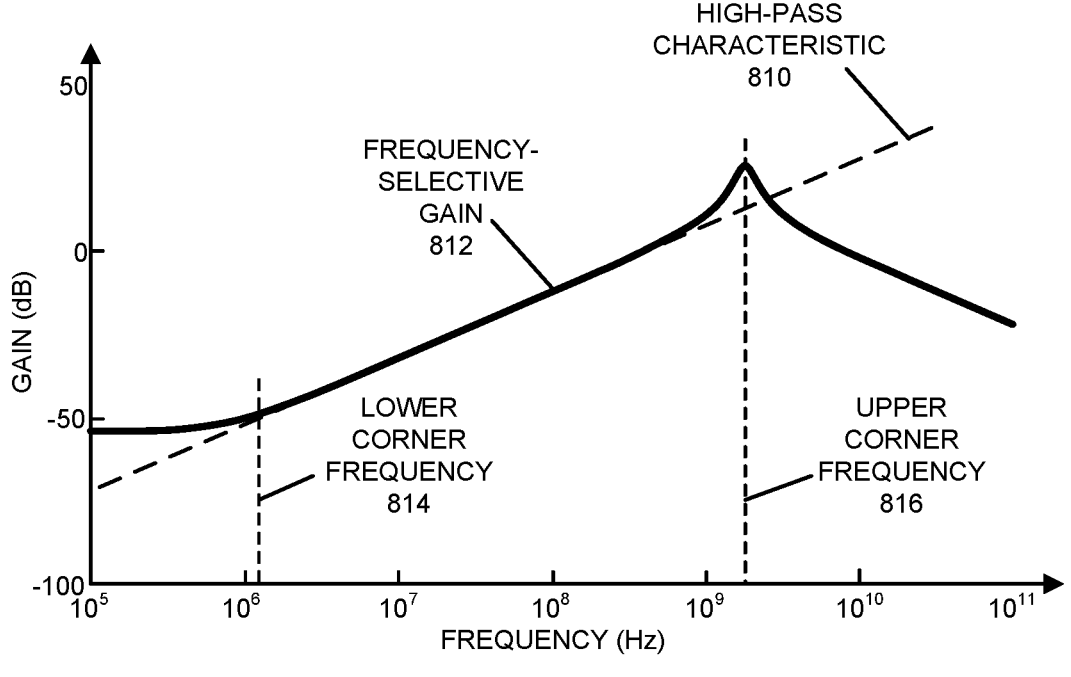
FIG. 8 presents a drawing illustrating an example of a frequency-selective gain of an analog pre-filter of a ranging receiver according to some embodiments of the present disclosure.

FIG. 8 presents a drawing illustrating an example of a frequency-selective gain 812 of the analog pre-filter. Ideally, the analog pre-filter may have a high-pass characteristic 810, shown by the dashed line in FIG. 8, In practice, the analog pre-filter may have frequency-selective gain 812 shown by the solid line in FIG. 8. Frequency-selective gain 812 may vary by 40-60 dB between 1 MHz and 500 MHz or 1 GHz. Moreover, the analog pre-filter may have a lower-corner frequency 814 and an upper-corner frequency 816 where frequency-selective gain 812 deviates from the ideal high-pass characteristic 810.

Figure 9:
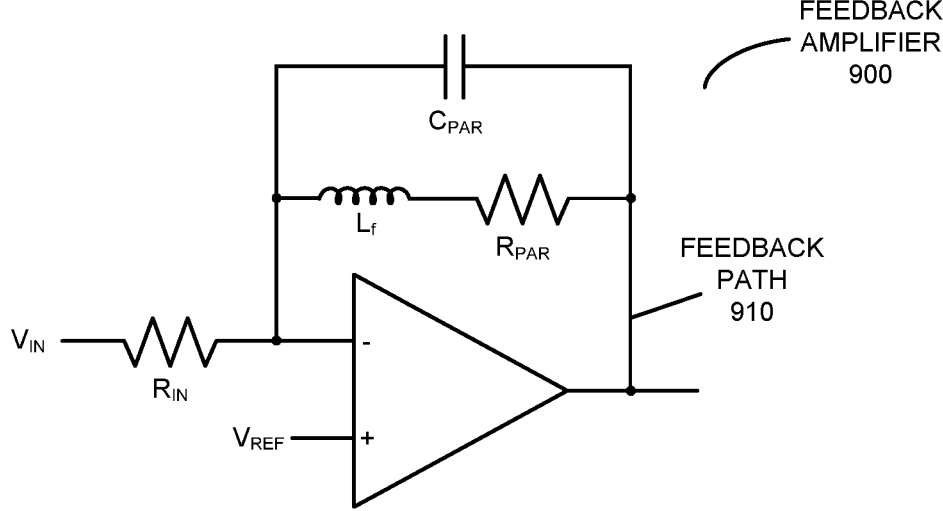
FIG. 9 presents a block diagram illustrating an example of a feedback amplifier according to some embodiments of the present disclosure.

In some embodiments, the analog pre-filter may be implemented using a feedback amplifier with a high-pass gain characteristic. For example, the analog pre-filter may be implemented using an operational amplifier or discrete transistors. FIG. 9 presents a block diagram illustrating an example of a feedback amplifier 900 according to some embodiments of the present disclosure. In FIG. 9, feedback amplifier 900 may include a low-pass filter in a feedback path 910 of feedback amplifier 900 in order to provide frequency-selective gain 212 (FIG. 8) in the forward path of feedback amplifier 900 that corresponds to a high-pass filter. Because the analog pre-filter may have a broad bandwidth, self-resonance of a component in feedback path 910 (such as an inductor) may be a limiting factor. Consequently, as shown in FIG. 9, the combination of an inductor in feedback path 910 with parasitic resistance and capacitance may provide a low-pass filter.

Note that in order to improve the noise and power consumption of the analog pre-filter, frequency-selective gain 812 (FIG. 8) may be implemented directly inside a transimpedance amplifier. For example, the feedback network of the transimpedance amplifier can be modified to be frequency-selective instead of resistive, as is often the case.

In some embodiments, feedback amplifier 900 may have a gain of $10^6$, an input resistance $R_{IN}$ of 150$\Omega$, a feedback inductance L of 20 nH, a parasitic capacitance of $C_{PAR}$ of 1 fF, and a parasitic resistance of $R_{par}$ 0.3$\Omega$. This feedback amplifier may provide approximately 62 dB of equalization over a band of frequencies corresponding to a range of approximately 240 m. Moreover, feedback amplifier 900 may provide 20 dB per frequency decade of frequency-selective gain 812 (FIG. 8). The signal-to-noise ratio of the ranging receiver 100 may be approximately constant (within 3 dB) over a range of 1-240 m. Furthermore, the input current to transceiver 110 (FIG. 1) may vary from 2.56 µA at 1 m to 24.1 nA at 240 m or a change of 23.8 dB, Additionally, the analog pre-filter may be implemented using a set of analog filters (such as filter bank) that are electrically coupled in series and/or in parallel. This approach may improve the dynamic range and/or the bandwidth of the analog pre-filter.

In order to recover the true or actual received signal, the ranging receiver may need to perform calibration (e.g., in the digital domain) of frequency-selective gain 812 (FIG. 8) of the analog pre-filter or BOA 614 (FIG. 6) and associated bias in the LO path. This may allow the intentionally distorted signal provided by the analog pre-filter or BOA 614 (FIG. 6) to be subsequently corrected in the digital domain based at least in part on one or more correction factors (such as the amount of gain provided by the frequency-selective gain at a given frequency). For example, the frequency-selective gain may increase the signal amplitude by +10 dB at 100 MHz. Consequently, in some embodiments, the digital correction may subsequently decrease the signal amplitude at 100 MHz by −10 dB. This may allow the reflectivity of an object to be accurately determined.

Note that the calibration may involve a digital spectral estimation procedure. Moreover, in some embodiments, during the calibration the gain and/or the phase characteristics of the analog pre-filter or BOA 614 (FIG. 6) may be measured using an internal signal. This may allow the calibration to be dynamically repeated, as needed. In LiDAR systems, a reference channel that is used to measure laser nonlinearity and optical characteristics may be used during the calibration. Notably, the LiDAR system may include an optical source that is looped back to the ranging receiver, so that an optical or laser signal is input to the transceiver without propagating through the atmosphere (and, based on measurements performed by a power detector, which may have a known power). Alternatively or additionally, an auxiliary sine-wave generator may provide a calibration signal to the ranging receiver during calibration.

After a calibration factor is measured during calibration, it may be stored in non-volatile memory in or associated with the ranging receiver. For example, one or more calibration factors may be stored in a look-up table. In some embodiments, the one or more calibration factors may be at a set of predefined frequencies. Alternatively or additionally, in some embodiments, the one or more calibration factors may include a cubic spline or may correspond to a theoretical curve. Furthermore, as noted previously, during or after the calibration, the stored one or more calibration factors may be used to perform a de-emphasis operation. For example, the ranging receiver may interpolate between at least some of the stored one or more calibration factors in order to determine a correction at a particular frequency.

Referring back to FIG. 5, thus in some embodiments control logic 130 may instruct a digital processing circuit to characterize the frequency-selective gain (such as an amplitude and/or a phase at a frequency) during a calibration mode. Moreover, the digital processing circuit may correct an output signal from ADC 124 based at least in part on the characterized frequency-selective gain. Furthermore, ranging receiver 500 may determine a range to an object, its relative velocity and/or a reflectivity of the object after the output signal is corrected for the characterized frequency-selective gain. In some embodiments, control logic 130 dynamically adapts the frequency-selective gain to reduce or eliminate a blocking signal at a second frequency. Notably, the frequency-selective gain may not be fixed. Instead, the frequency-selective gain may be adapted (e.g., periodically) to include dynamic notch filtering to null signals (which are sometimes referred to as 'blockers' in communication systems) from bright reflectors, which may be seen after a first round of digital spectral estimation. For example, control logic 130 may perform dynamic adaptation of the frequency-selective gain provided by one or more components in the ranging receiver. Note that filtering of the blocking signals associated with bright reflectors may improve the capability of the ranging receiver (or an electronic device or a system that includes the ranging receiver) to measure fainter sources at different ranges without ADC saturation (which may otherwise occur in the presence of the blocking signals). In some embodiments, blocking signals may arise from known reflections at close range in the signal path from the transmitter to the object. For example, blocking signals may be associated with the physical layout of the housing of the ranging receiver (or an electronic device or a system that includes the ranging receiver) and associated transmit windows (such as glass or dirt deposited or collected on a transmit window), or from highly reflective objects in the field of view (such as a vehicle bumper or a street sign) whose position, once cataloged, need to be removed from subsequent observations of the same field of view. In embodiments where a blocking signal occurs at a close range to the ranging receiver (such as a transmit window or a vehicle bumper), the blocking signal may be eliminated using a wideband bandpass filter (such as 500 MHz) that cuts out or eliminates frequencies below 1 MHz.

Note that the disclosed frequency-selective compensation in the circuit techniques may be different from automatic gain control or leveling control in communications receivers, where the quantity that is being controlled is the amplitude of the received signal, which is typically narrowband. Similarly, the frequency-selective compensation in the circuit techniques may be different from a narrowband channel selective filter in a communications receiver. In contrast, in ranging receivers or ranging systems, the bandwidth of the received signal may be very wide. For example, the received signal may correspond to ranges between 0.1-1 m and 300 m. Consequently, concentrating on signal amplitude at one given frequency is typically not feasible.

The circuit techniques may provide a flexible tradeoff between the ADC sampling rate, a probability of detecting an object, and the probability of a false alarm. Note that the ranging receiver may include one or more of the preceding embodiments. Moreover, resampling at the output of the variable-rate ADC may be performed to aid digital signal processing (such as correlation). For example, the ADC output may be resampled, so that it has a constant (or approximately constant) sampling rate. In some embodiments, the resampling may involve interpolating between samples in the output from the ADC (such as using minimum bandwidth interpolation or another interpolation technique). However, when the number of pulses (or symbols) or a length of the transmit signal is sufficiently long, resampling of the output may not be needed.

In some embodiments, ADC 124 in the ranging receiver may have less than 8 bits of resolution or a dynamic range of 48 dB with a sampling rate of 1-2 Gs/s. Alternatively, in some embodiments, ADC 124 in the ranging receiver may have 18 bits of resolution or a dynamic range of 80 dB with a sampling rate of 1-2 Gs/s. Note that ADC 124 may include: a successive-approximation-register (SAR) ADC, another type of interleaved ADC, a pipeline ADC, a flash ADC, or another type of ADC.

Furthermore, in order to reduce interference, in some embodiments the transmit signals in a sequence of time intervals are encoded using unique codes in a set of unique codes (such as pulse-position modulation codes) with a random or a device-specific starting unique code. For example, a given unique code may be used for a given time interval (such as 100 ns) that is small compared to a measurement window. Different unique codes may be used in subsequent time intervals during a time period until all the unique codes in the set of unique codes have been used (such as a time period of 2.5 or 5 μs), at which point the process may iterate and start again with the same random or device-specific starting unique code.

In some embodiments, the sampling rate may be based at least in part on digital processing of the received signal over a time interval (e.g., having a duration between 5 μs to 15 ms). Depending on what is received (e.g., when there is no high-frequency content in the spectral domain following FFT), control logic may decrease sampling rate of the ADC in a subsequent time interval (e.g., having a duration between 5 μs to 15 ms). Moreover, after the subsequent time interval, if there is no indication to keep the sampling rate low (such as based at least in part on side-channel information of the content in the spectral domain), the control logic may default to a higher sampling rate.

Additionally, in some embodiments, the circuit techniques use rate of innovation sampling, where the innovation in a received signal may be associated with or correspond to an amount of information of a surprise level (assuming short-timescale stability of the received signal). If the surprise level is high, the control logic may increase the sampling rate of the ADC. This may allow the ranging receiver to better detect transient signals. Alternatively, when the surprise level is low, the control logic may decrease the sampling rate of the ADC. Note that initially the sampling rate may be high. Then, as the circuit learns more, the control logic may lower the sampling rate. In some embodiments, the circuit techniques may use random sampling (instead of a constant-rate sampling). For example, the random sampling may be performed on a sample-by-sample basis (and, thus, may vary randomly from sample to sample) or over a time interval in N time intervals, where N is a non-zero integer (and, thus, may be constant in a given time interval in the N time intervals, but may vary randomly in adjacent time intervals in the N time intervals).

Note that the circuit techniques may be implemented using discrete components or integrated components (such as in an integrated circuit). Thus, in some embodiments, some or all of the components in the ranging receiver may be implemented using one or more integrated circuits.

The circuit techniques may be used in a wide variety of ranging receivers for different types of received signals, including: optical (such as LiDAR), sonar, ultrasound or radar. Moreover, the circuit techniques may be used in a wide variety of applications, such as: automotive (e.g., partial or fully-automated vehicles), aircraft, drone, satellite-based mapping (e.g., a geographic information system), physical sciences (e.g., a particle accelerator or a detector), etc. Consequently, the different types of received signals may occur in a variety of different bands of frequencies.

Figure 10:
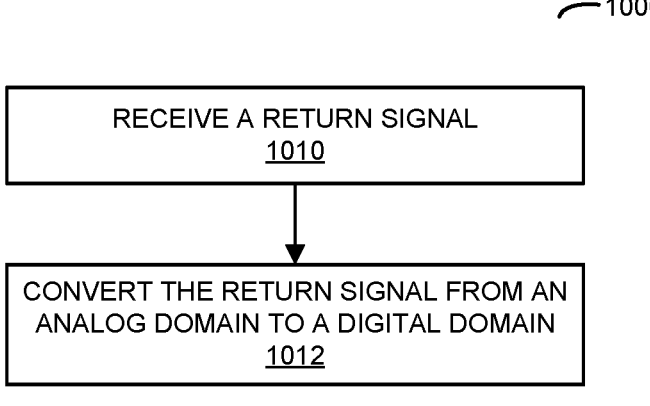
FIG. 10 is a flow diagram illustrating an example of a method for sampling a return signal according to some embodiments of the present disclosure.

We now describe embodiments of a method. FIG. 10 presents a flow diagram illustrating an example of a method 1000 for sampling a return signal using a ranging receiver, such as ranging receiver 100 (FIG. 1), ranging receiver 200 (FIG. 2), ranging receiver 300 (FIG. 3), ranging receiver 400 (FIG. 4) or ranging receiver 500 (FIG. 5). During operation, the ranging receiver may receive the return signal (operation 1010) corresponding to a transmit signal. Then, the ranging receiver may convert, using an ADC, the return signal (operation 1012) from an analog domain to a digital domain, where the ADC has a time-variant sampling rate. In some embodiments of the method 1000, there may be additional or fewer operations. Moreover, the order of the operations may be changed, and/or two or more operations may be combined into a single operation.

The disclosed circuit techniques can be (or can be included in) any electronic device. For example, the electronic device may include: a cellular telephone or a smartphone, a tablet computer, a laptop computer, a notebook computer, a personal or desktop computer, a netbook computer, a media player device, an electronic book device, a MiFi® device, a smartwatch, a wearable computing device, a portable computing device, a consumer-electronic device, an access point, a router, a switch, communication equipment, test equipment, a vehicle, a ship, an airplane, a drone, a helicopter, a car, a truck, a bus, a motorcycle, manufacturing equipment, farm equipment, construction equipment, or another type of electronic device.

Although specific components are used to describe the embodiments of the integrated circuit, in alternative embodiments different components and/or subsystems may be present in the integrated circuit and/or a ranging receiver. Thus, the embodiments of the integrated circuit and/or the ranging receiver may include fewer components, additional components, different components, two or more components may be combined into a single component, a single component may be separated into two or more components, one or more positions of one or more components may be changed, and/or there may be different types of components.

Moreover, the circuits and components in the embodiments of the integrated circuit and/or the ranging receiver may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

As noted previously, an integrated circuit may implement some or all of the functionality of the circuit techniques. This integrated circuit may include hardware and/or software mechanisms that are used for implementing functionality associated with the circuit techniques.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:
a ranging receiver configured to receive a return signal corresponding to a transmit signal, down convert the return signal, and equalize the down converted return signal, wherein the equalization comprises a proportional gain applied to the down converted return signal based at least in part on a frequency of the down converted return signal, and wherein a higher frequency has a higher gain; and
an analog-to-digital converter (ADC), with a time-variant sampling rate, configured to convert the return signal from an analog domain to a digital domain, resample an output, and adjust the time-variant sampling rate based at least in part on a correlation corresponding to the output.

2. The integrated circuit of claim 1, wherein the ranging receiver is configured to increase the sampling rate when the return signal is detected.

3. The integrated circuit of claim 2, wherein the ranging receiver is configured to detect the return signal using multiple symbols or pulses in the return signal.

4. The integrated circuit of claim 1, wherein the ranging receiver is configured to increase the sampling rate as a function of time after the transmit signal is output.

5. The integrated circuit of claim 4, wherein the sampling rate is increased based at least in part on a predefined function.

6. The integrated circuit of claim 5, wherein the predefined function comprises: a stepwise function, or a closed-form expression.

7. The integrated circuit of claim 1, wherein the ranging receiver comprises a comparator having a time-variant threshold; and
wherein the comparator is configured to selectively change the sampling rate based at least in part on a comparison of a detection signal corresponding to the return signal and the time-variant threshold.

8. The integrated circuit of claim 7, wherein the ranging receiver comprises a matched filter configured to determine the correlation of the return signal and a target signal, and to provide the detection signal.

9. The integrated circuit of claim 7, wherein the ranging receiver is configured to decrease the time-variant threshold as a function of time after the transmit signal is output.

10. The integrated circuit of claim 9, wherein the time-variant threshold is decreased based at least in part on a predefined function.

11. The integrated circuit of claim 10, wherein the predefined function comprises: a stepwise function, or a closed-form expression.

12. The integrated circuit of claim 7, wherein the comparator comprises hysteresis, and after the sampling rate is increased to a higher sampling rate, the comparator is configured to maintain the higher sampling rate for a time interval corresponding to the transmit signal.

13. The integrated circuit of claim 1, wherein the ranging receiver comprises a time-of-flight ranging receiver.

14. The integrated circuit of claim 1, wherein the integrated circuit comprises a transmitter configured to encode transmit signals using a set of unique codes over a time period;

wherein, during a given time interval in the time period, a given transmit signal is encoded using a given unique code that is different from the unique codes used in other time intervals in the time period; and wherein the transmitter is configured to select a starting unique code in the set of unique codes for use in a first time interval in the time period based at least in part on a random value or a transmitter-specific value, and the unique codes in the set of unique codes that are used in subsequent time intervals in the time period are based at least in part on a predefined pattern.

15. The integrated circuit of claim 14, wherein the given unique code comprises a pulse-position modulation code.

16. The integrated circuit of claim 14, wherein the predefined pattern comprises a sequential wrap-around order in the set of unique codes.

17. An electronic device, comprising:

a ranging receiver configured to receive a return signal corresponding to a transmit signal, down convert the return signal, and equalize the down converted return signal, wherein the equalization comprises a proportional gain applied to the down converted return signal based at least in part on a frequency of the down converted return signal, wherein a higher frequency has a higher gain; and wherein the ranging receiver is further configured to calibrate the ranging receiver based at least in part on the proportional gain, store the calibration as a calibration factor, and digitally correct the equalized down converted return signal; and an analog-to-digital converter (ADC), with a time-variant sampling rate, configured to convert the return signal from an analog domain to a digital domain, resample an output, and adjust the time-variant sampling rate based at least in part on a correlation corresponding to the output.

18. The electronic device of claim 17, wherein the ranging receiver is configured to increase the sampling rate when the return signal is detected or to increase the sampling rate as a function of time after the transmit signal is output.

19. A method for sampling a return signal, comprising:

by a ranging receiver:

receiving the return signal corresponding to a transmit signal;

converting, using a local oscillator, the return signal to a down converted return signal;

equalizing the down converted return signal based at least in part on a frequency of the down converted return signal;

calibrating the ranging receiver;

converting, using an analog-to-digital converter (ADC), the return signal from an analog domain to a digital domain, wherein the ADC has a time-variant sampling rate;

correcting the equalized down converted return signal in the digital domain; and resampling an output, and adjusting the time-variant sampling rate based at least in part on a correlation corresponding to the output.

20. The method of claim 19, wherein the method comprises increasing the sampling rate when the return signal is detected or increasing the sampling rate as a function of time after the transmit signal is output.

21. The integrated circuit of claim 1, further configured to calibrate the ranging receiver based at least in part on the proportional gain, store the calibration as a calibration factor, and digitally correct the equalized down converted return signal.

* * * * *